(12) United States Patent
Bräunlich et al.

(10) Patent No.: US 7,574,268 B2
(45) Date of Patent: Aug. 11, 2009

(54) MODULAR CONTROL SYSTEM WITH TERMINAL AND FUNCTION MODULES

(75) Inventors: Michael Bräunlich, Chemnitz (DE); Frank-Günter Meier, Limbach-Oberfrohna (DE)

(73) Assignee: Siemens Aktiengesellschaft, Munich (DE)

( * ) Notice: Subject to any disclaimer, the term of this patent is extended or adjusted under 35 U.S.C. 154(b) by 264 days.

(21) Appl. No.: 11/522,229

(22) Filed: Sep. 15, 2006

(65) Prior Publication Data

US 2007/0066147 A1    Mar. 22, 2007

(30) Foreign Application Priority Data

Sep. 16, 2005    (EP) .................................. 05020253

(51) Int. Cl.
*G05B 15/00*    (2006.01)
*G06F 11/00*    (2006.01)
(52) U.S. Cl. ............................................ 700/1; 714/19
(58) Field of Classification Search ...................... 700/1; 714/19
See application file for complete search history.

(56) References Cited

U.S. PATENT DOCUMENTS

| | | | |
|---|---|---|---|
| 4,171,861 A | | 10/1979 | Hohorst |
| 5,496,183 A | * | 3/1996 | Soes et al. ..................... 439/79 |
| 6,098,117 A | * | 8/2000 | Foote et al. .................... 710/8 |
| 6,175,932 B1 | * | 1/2001 | Foote et al. .................... 714/9 |
| 6,182,179 B1 | * | 1/2001 | Foote et al. ................. 710/313 |
| 2001/0039149 A1 | | 11/2001 | Dooley |

FOREIGN PATENT DOCUMENTS

| | | |
|---|---|---|
| DE | 198 07 710 A1 | 9/1999 |
| FR | 2582451 A | 11/1986 |

OTHER PUBLICATIONS

ET 200S, "SIMATIC DP—Siemens", www2.automation.siemens.com/printPreview/simatic/dp/html_00/produkte/et20..., Retrieved May 27, 2005, pp. 1-2.
Siemens, "SIMATIC ET 200S", http://www.automation.siemens.com/simatic/dp/html_76/produkte/et200s.htm  Retrieved Oct. 27, 2008 and attached herewith.
Siemens, "Solutions with distributed SIMATIC ET 200S-Modules" http://www.automation.siemens.com/simatic/regelsysteme/html_76/produkte/sb-module.htm  Retrieved Oct. 27, 2008 and attached herewith.

* cited by examiner

*Primary Examiner*—Albert DeCady
*Assistant Examiner*—Thomas H Stevens

(57) ABSTRACT

A modular control system, which is constructed from terminal modules and function modules to fit these, for use in industrial automation in particular is provided. With the known embodiments, which comprise different terminal modules for different functionalities, subsequent system extensions can often only be achieved with significant outlay. With the inventive modular control system this problem is resolved by the use of novel terminal modules of identical structure, with the different functionalities being provided by additional function units. Additional advantages, in addition to simpler modification of the system configuration, are lower planning and assembly outlays, simpler and error-free pre-assembly of the standard terminal modules, simpler stocking of spare parts, clear transparency in respect of the supply of supply voltages, potential forwarding and separation and specialist functions such as simple and transparent handling during gradual commissioning.

5 Claims, 3 Drawing Sheets

MODULAR CONTROL SYSTEM WITH TERMINAL AND FUNCTION MODULES

CROSS REFERENCE TO RELATED APPLICATIONS

This application claims priority of European application No. 05020253.0 EP filed Sep. 16, 2005, which is incorporated by reference herein in its entirety.

FIELD OF INVENTION

The invention relates to a terminal module with terminals, on which a function module can be mounted, for the modular construction of a control system, the terminal module having contacts on both sides, which are connected internally to each other for electrical purposes and also have electrical connections to the interface for the function modules. The invention also relates to a function unit and a control system with a module structure, having at least two such terminal modules and at least one such function unit.

BACKGROUND OF INVENTION

Such a system is used in particular in the field of industrial automation. Industrial controllers with a modular configuration are frequently sub-divided into terminal modules and function modules to fit these (digital or analog inputs or outputs, counters and other specialist modules). The wiring can thus be put in place after the terminal-bearing terminal modules have been lined up next to each other. The terminal modules are responsible both for coupling peripheral signals and for forwarding internal control signals. Because of their function, specific types of terminal modules are necessary and possible:

Supply modules, which allow a supply voltage to be supplied for digital I/O functions (opening of a potential group for digital function modules, which are to be supplied from a network device), Forwarding modules, which forward the supply voltage to the next terminal module and make it available to the function module (where the next digital I/O module is to be supplied by the same network device), Loop-through modules, which forward the supply voltage to the next terminal module but do not make it available to the function module (where one or more analog function modules are required at a point but the potential group is not to be cleared so no new supply module is then to be used), Separator modules, which do not forward the supply voltage (analog function modules or specialist modules can be mounted here) and Specialist modules, which contain a temperature sensor for example to measure the terminal reference temperature.

The mounting of the function modules completes the controller according to the planned function scope. A modular structure of this type allows the degree of expansion of the controller to be tailored relatively precisely to the control tasks required locally, particularly when used in a decentralized instance.

SUMMARY OF INVENTION

As the overall function scope of such a modular controller means that several of the above-mentioned specific terminal modules frequently have to be used, a corresponding outlay is required for planning and ordering as well as for assembly. A major disadvantage results in particular when control functions are subsequently extended. If functions are added to a potential group for example, a large part of the structure frequently has to be modified with the wires detached to re-arrange the terminal modules.

Correspondingly configured terminal modules—as described above—are known from the Siemens ET 200S control system but these do not resolve this problem. Other similar applications, for example Mitsubishi Electric's MELSEC ST also fail to resolve the problem.

An object of the invention is create a control system with a modular structure with terminal modules and function units of the type mentioned in the background section, which reduces the outlay for planning and ordering as well as for assembly compared with known systems and renders re-arrangement of the terminal modules and the rewiring optionally associated therewith unnecessary during system extensions.

This object is achieved with a terminal module of the type mentioned in the background section in that the terminal module has contacts for a function unit, the function unit being provided to provide a required functionality of the terminal module.

This object is also achieved by a function module for providing the functionality of at least one terminal module, each terminal module having contacts on both sides, which are connected internally to each other for electrical purposes and also have electrical connections to an interface for a function module, which can be mounted on the terminal module, the function unit being provided for the connection of at least two terminal modules connected in a chain, by mounting on the corresponding contacts.

This object is finally achieved by a control system with a module structure with the features specified in the claims.

The inventive use of terminal modules of identical structure, the different functionalities of which are achieved by at least one additional mountable function unit, to construct a modular control system results in simpler and error-free pre-assembly of the standard terminal modules and significantly easier modification of the system configuration. The stocking of spare parts is simplified considerably for the user, particularly with a view to planned modifications and extensions.

In one advantageous embodiment the terminals on the standard terminal modules are reduced to a maximum cross-section of 1.5 mm^2, which is adequate for the actual task, as the connection for a voltage supply and one, if necessary, PE (protective earth) connection can be attached to a function unit designed as a supply unit and a minimum cross-section of 2.5 mm^2 is required for the PE connection with a supply for distribution purposes.

In one similarly advantageous embodiment the function units have means for visualizing the functionality provided. This allows easy optical control of the structure and makes the entire control system readily transparent with regard to the supply of supply voltages, potential forwarding and separation and specialist functions.

In one particularly advantageous embodiment two adjacent terminal modules can be connected respectively by means of the function units and a maximum width of the width of a terminal module is provided for the function units. This means that the individual function units can be assembled together individually in a chain, the function units being mounted on the contacts of the respective terminal modules in the half-grid. If the function units have precisely the width of a terminal module, adjacent terminal modules are connected to the function units such that it is possible to line the function units up precisely next to each other. The use of function units, by means of which only two adjacent terminal modules are connected respectively, allows simple and transparent handling during gradual commissioning and it is possible to disconnect individual potential groups without detaching wires.

In one advantageous embodiment one function unit is designed as a supply unit, having terminals for connecting a supply voltage, which can be applied via an internal electrical connection only at the right contacts, with the result that the terminal module on the left can be separated from a potential group that can be started at the terminal module on the right. This so-called "supply unit R" can thus be used at points, where a new potential group is to be opened after an existing one.

In a further advantageous embodiment one function unit is designed as a supply unit, having terminals for connecting a supply voltage, which can be applied via an internal electrical connection only at the left contacts, with the result that the terminal module on the right can be separated from a potential group that can be started at the terminal module on the left. This so-called "supply unit L" can thus also be used at points, where a new potential group is to be opened after an existing one.

In a further advantageous embodiment one function unit is designed as a supply unit, having terminals for connecting a supply voltage, which can be applied via an internal electrical connection at the left and right contacts. This so-called "supply unit A" can thus be used at points, where a new potential group is to be opened after an existing separation or directly at the start.

In one particularly advantageous embodiment these function units designed as supply units also have an additional terminal for a PE connection.

In a further particularly advantageous embodiment a minimum cross-section of 2.5 mm^2 is provided for said PE connection, as required for a supply for distribution purposes.

In a similarly advantageous embodiment one function unit is designed as a bridge unit, having an internal electrical connection between all or only certain of the left and right contacts. Potential groups can thus be created with or without PE.

In a further advantageous embodiment one function unit is designed as a separator unit, having no internal electrical connection between the left and right contacts. A potential group is hereby terminated and analog or specialist modules can be mounted.

In one particularly advantageous embodiment one function unit is designed as a specialist unit, which can for example contain one or two temperature sensors.

In one advantageous embodiment of the control system, said control system has an interface module with an interface terminal connection at the start of the chain of at least two terminal modules.

In a similarly advantageous embodiment of the control system, said control system has a termination module at the end of the chain of at least two terminal modules.

In one particularly advantageous embodiment of the control system, a termination unit is provided at the start and end of the chain comprising at least one function unit, by means of which the chain comprising at least two terminal modules can be connected, to cover the free contacts. This can be of identical structure.

These termination units advantageously have a width that is essentially half the width of a terminal module.

BRIEF DESCRIPTION OF THE DRAWINGS

The invention is described and explained in more detail below with reference to the exemplary embodiments shown in the FIGS., in which.

DETAILED DESCRIPTION OF INVENTION

Figure 1:
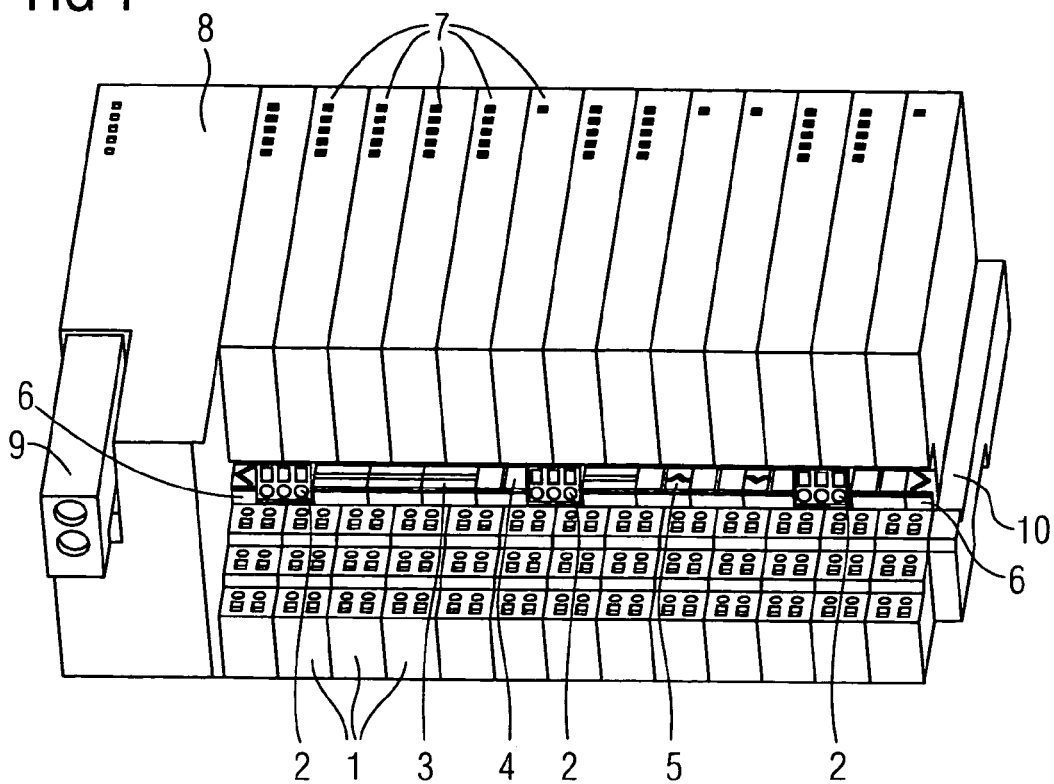
FIG. 1 shows an exemplary embodiment of the inventive control system complete with terminal and function modules, interface and termination module, interface terminal connector and function units.

FIG. 1 shows an exemplary embodiment of the inventive control system, comprising a chain of terminal modules 1 with terminals 14, on which function modules 7 are mounted. At the start of the chain of terminal modules 1 is an interface module 8 with an interface terminal connector 9, with a termination module 10 forming the end of the chain. In this exemplary embodiment the function units only connect two adjacent terminal modules 1 respectively, with the width of the function units corresponding precisely to the width of a terminal module 1. The FIG. shows three supply units 2 with three terminals for the power supply and a PE connection. There are also bridge units 3 and separator units 4, which are easy to distinguish due to their different markings 15. There are also two specialist units 5; the start and end of the chain of function units are each formed by one termination unit 6.

Figure 2:
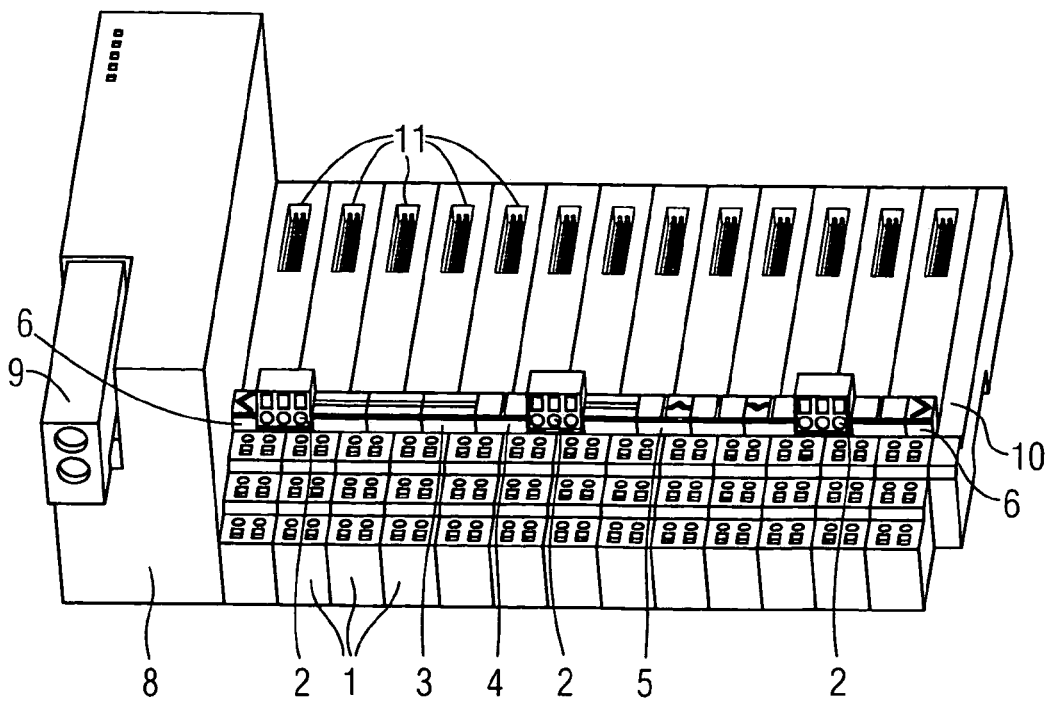
FIG. 2 shows the inventive control system from FIG. 1 without function modules.

FIG. 2 shows the same exemplary embodiment as in FIG. 1 but without the function modules 7. It therefore shows the interfaces to the function modules 11 with the contacts, on which the function modules 7 are mounted. For the description of the further reference characters in FIG. 2, please refer to the description relating to FIG. 1.

Figure 3:
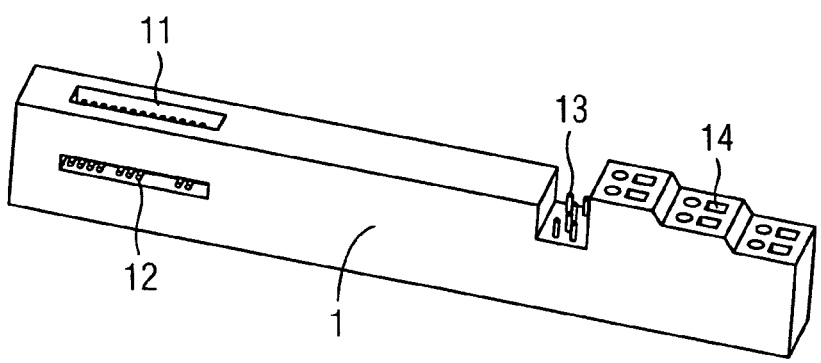
FIG. 3 shows an inventive terminal module.

FIG. 3 shows a single terminal module 1 with an interface to the function module 11, the contacts for control signals 12, the contacts for function units 13 and the terminals 14.

Figure 4:
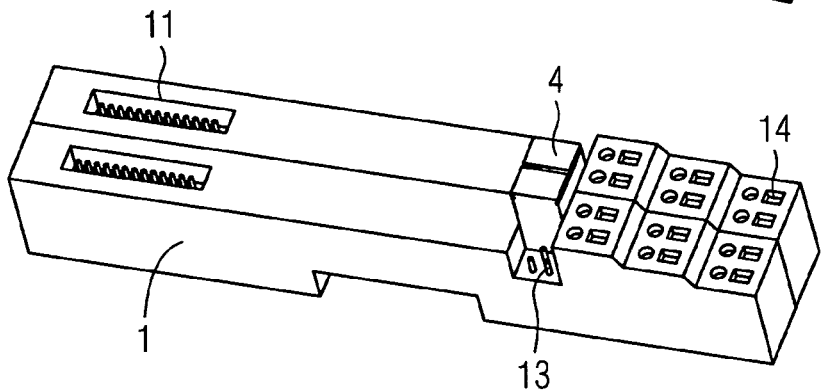
FIG. 4 shows two of the inventive terminal modules, which are connected to an exemplary embodiment of a function unit.

FIG. 4 shows two inventive terminal modules 1, which are connected to a function unit designed as a supply unit 2. The width of the function unit corresponds to the width of a terminal module 1, such that the function units mounted on the terminal modules 1 in the half-frame are lined up next to each other without a gap. Those contacts for the function units 13 which are still free, if a further terminal module 1 is connected, are occupied by a further function unit or by a termination unit 6 at the start or end of the chain of terminal modules 1. The interfaces to the function modules 11 and the terminals 14 of the terminal modules 1 are again also shown.

Figure 5:
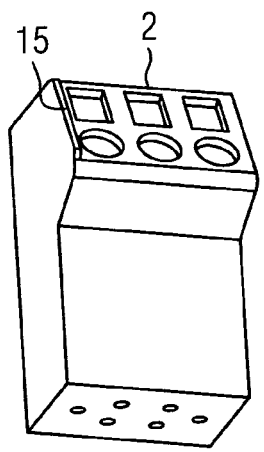
FIG. 5 shows a "supply unit R" with a PE connection, as an exemplary embodiment of a supply unit.

FIG. 5 shows an exemplary embodiment of a supply unit 2 in the form of a "supply unit R" with a PE connection, at which a connected supply voltage is applied via an internal electrical connection only at the contacts on the right. To the left of the terminals for the power supply and the PE connection is a marking 15, which identifies the supply unit 2 by means of a vertical burr as an indication of separation.

Figure 6:
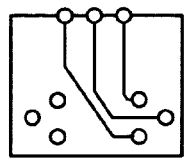
FIG. 6 shows a circuit diagram of the "supply unit R" from FIG. 5.

FIG. 6 shows a circuit diagram of the "supply unit R" from FIG. 5, from which it can be seen how the internal electrical connection is connected.

Figure 7:
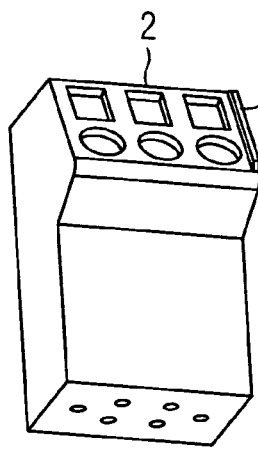
FIG. 7 shows a "supply unit L" with a PE connection as an exemplary embodiment of a supply unit.

FIG. 7 shows an exemplary embodiment of a supply unit 2 in the form of a "supply unit L" with a PE connection, at which a connected supply voltage is applied via an internal electrical connection only at the contacts on the left. To the right of the terminals for the power supply and the PE connection is a marking 15, which identifies the supply unit 2 by means of a vertical burr as an indication of a separation.

Figure 8:
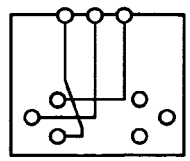
FIG. 8 shows a circuit diagram of the "supply unit L" from FIG. 7.

FIG. 8 shows a circuit diagram of the "supply unit L" from FIG. 7, from which it can be seen how the internal electrical connection is connected.

Figure 9:
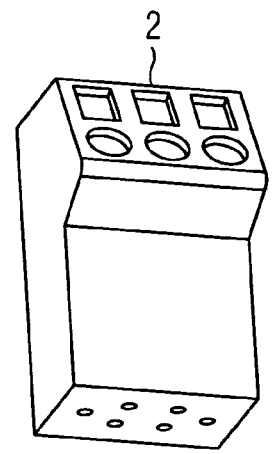
FIG. 9 shows a "supply unit A" with a PE connection as an exemplary embodiment of a supply unit.

FIG. 9 shows an exemplary embodiment of a supply unit 2 in the form of a "supply unit A" with a PE connection, at which a connected supply voltage is applied via an internal electrical connection at the left and right contacts.

Figure 10:
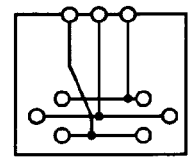
FIG. 10 shows a circuit diagram of the "supply unit A" from FIG. 9.

FIG. 10 shows a circuit diagram of the "supply unit A" from FIG. 9, from which it can be seen how the internal electrical connection is connected.

Figure 11:
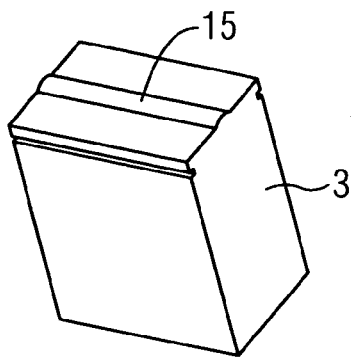
FIG. 11 shows a function unit designed as a bridge unit viewed from above.

FIG. 11 shows a function unit designed as a bridge unit 3, having an internal electrical connection between all the left and right contacts. In the case of a bridge unit 3, the marking 15 for the function unit to visualize a continuous electrical connection is a continuous horizontal burr, as shown clearly in this diagram viewed from above.

Figure 12:
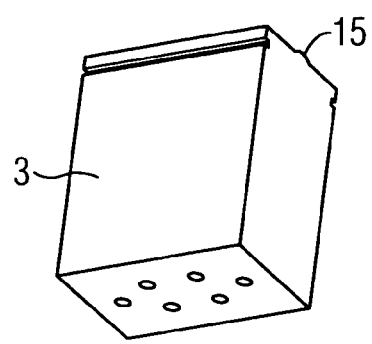
FIG. 12 shows the bridge unit from FIG. 11 viewed from below.

FIG. 12 shows the bridge unit 3 from FIG. 11 viewed obliquely from below looking toward the contacts, which connect two terminal modules 1 together in the exemplary embodiment shown.

Figure 13:
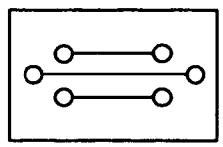
FIG. 13 shows a circuit diagram of the bridge unit from FIG. 11 and FIG. 12.

FIG. 13 shows a circuit diagram of the bridge unit 3 from FIG. 11 and FIG. 12, from which it can be seen how the internal electrical connection is connected.

Figure 14:
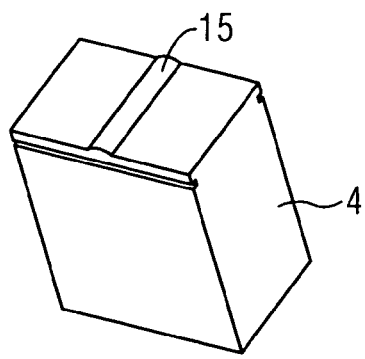
FIG. 14 shows a function unit designed as a separator unit viewed from above.

FIG. 14 shows a function unit designed as a separator unit 4, having no internal electrical connection between the left and right contacts. In the case of a separator unit 4 —as with the supply units 2 in FIGS. 5, 7 and 9—the marking 15 for the function unit to visualize no continuous electrical connection is a vertical burr.

Figure 15:
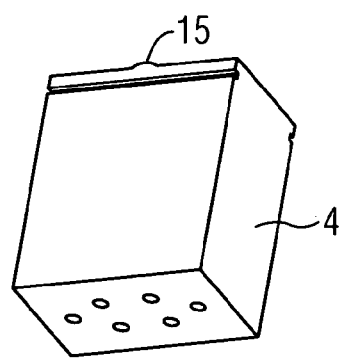
FIG. 15 shows the separator unit from FIG. 14 viewed from below.

FIG. 15 shows the separator unit 4 from FIG. 14 viewed obliquely from below looking toward the contacts, which connect two terminal modules 1 together in the exemplary embodiment shown.

Figure 16:
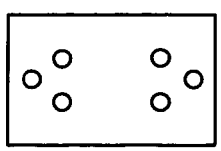
FIG. 16 shows a circuit diagram of the separator unit from FIG. 14 and FIG. 15.

FIG. 16 shows a circuit diagram of the separator unit 4 from FIG. 14 and FIG. 15, from which it can be seen how the internal electrical connection is connected.

To summarize, the invention relates to a modular control system, comprising terminal modules and function modules to fit these, for use in industrial automation in particular. With the known embodiments, which comprise different terminal modules for different functionalities, subsequent system extensions can often only be achieved with significant outlay. With the inventive modular control system this problem is resolved by the use of novel terminal modules of identical structure, with the different functionalities being provided by additional function units. Additional advantages, in addition to simpler modification of the system configuration, are lower planning and assembly outlays, simpler and error-free pre-assembly of the standard terminal modules, simpler stocking of spare parts, clear transparency in respect of the supply of supply voltages, potential forwarding and separation and specialist functions such as simple and transparent handling during gradual commissioning.

The invention claimed is:

1. A function unit providing functionality for a terminal module of a control system in an industrial automation system, each terminal module having an interface for connecting to a function module and a contact for connecting to the function unit, the function unit comprising:
    a left connector for connecting to a left terminal module;
    a right connector for connecting to a right terminal module,
    wherein the function unit allows at least two terminal modules to be connected in a chain by mounting the left and right connectors to the left and right terminal modules respectively,
    wherein the function unit provides a function to connected terminal modules such that the terminal modules do not require reassembly when the functionality is changed;
    wherein the function unit comprises a visual indicator that visually identifies the function of the function unit;
    wherein the left and right terminal modules are adjacent;
    wherein a maximum width of the function unit is a width of the terminal module;
    wherein the function unit is a supply unit having terminals to connect a supply voltage providing a voltage connection to the left and right connectors, thereby a voltage is supplied to the right and left terminal modules when the function unit is connected to the right and left terminal modules; and
    wherein an additional terminal for a PE (protective earth) connection with a minimum cross-sectional area of 2.5 mm^2 is provided for the PE connection.

2. A modular control system comprising:
    a plurality of function modules of different types for performing sense and control functions in an automation system, all of the function modules having a substantially equal given width;
    an interface module with an interface terminal connector;
    a plurality of terminal modules mounted side-by-side, forming a chain of the terminal modules, a first of the terminal modules electrically connected to the interface module, each of the terminal modules having substantially the given width;
    each terminal module comprising an interface for interchangeably mounting and electrically connecting any of the function modules to the terminal module;
    a plurality of function units of different types, each function unit having substantially the given width, each function unit comprising left and right side contacts, each function unit providing a given type of interconnection between two adjacent function modules;
    wherein each terminal module comprises left and right side contacts such that the left side contacts of each terminal module match the right side contacts of each function unit for physical engagement, and the right side contacts of each terminal module match the left side contacts of each function unit for physical engagement;

wherein any given function unit releasably spans between any two adjacent terminal modules by engagement between respective contacts on the given function unit and matching contacts on the two adjacent terminal modules; and wherein the plurality of function units comprise:

a bridge function unit in which the left side contacts are electrically connected internally to the right side contacts;

a separator function unit in which the left side contacts are not electrically connected to the right side contacts;

a supply function unit "R" comprising externally accessible voltage supply terminals electrically connected internally to only the right side electrical contacts;

a supply function unit "L" comprising externally accessible voltage supply terminals electrically connected internally to only the left side electrical contacts; and a supply function unit "A" comprising externally accessible voltage supply terminals electrically connected internally to both the left and right side electrical contacts.

3. The modular control system of claim 2, wherein each of the function units comprises an externally visible symbolic indicator of a type of each respective function unit.

4. The modular control system of claim 3, further comprising a specialist function unit comprising a temperature sensor.

5. The modular control system of claim 4, further comprising:

a termination function unit having substantially half of the given width, comprising contacts that match the left side contacts of each terminal module; and a termination function unit having substantially half of the given width, comprising contacts that match the right side contacts of each terminal module.

* * * * *